United States Patent [19]

Uesugi

[11] Patent Number: 5,122,478
[45] Date of Patent: Jun. 16, 1992

[54] IMPURITY DIFFUSION METHOD

[75] Inventor: Fumito Uesugi, Itami, Japan

[73] Assignee: Mitsubishi Denki Kabushiki Kaisha, Japan

[21] Appl. No.: 596,542

[22] Filed: Oct. 11, 1990

[30] Foreign Application Priority Data

Apr. 18, 1990 [JP] Japan .................................. 2-102637

[51] Int. Cl.[5] .......................................... H01L 21/225
[52] U.S. Cl. .................................... 437/160; 437/987;
437/954; 148/DIG. 35
[58] Field of Search ............... 437/587, 954, 160, 958;
148/DIG. 157, DIG. 35, DIG. 32

[56] References Cited

U.S. PATENT DOCUMENTS

| | | | |
|---|---|---|---|
| 4,980,313 | 12/1990 | Takahashi et al. | 437/987 |
| 4,987,097 | 1/1991 | Nitta et al. | 437/987 |
| 5,023,199 | 6/1991 | Murakami et al. | 437/160 |

FOREIGN PATENT DOCUMENTS 62-98721 5/1987 Japan .
63-20878 1/1988 Japan .

Primary Examiner—Brian E. Hearn
Assistant Examiner—Trung Dang
Attorney, Agent, or Firm—Leydig, Voit & Mayer

[57] ABSTRACT

A method for diffusing an impurity into a semiconductor includes producing a first semiconductor layer which does not include an element which alloy-reacts with the impurity on a surface of a compound semiconductor which includes a constitutional element that alloy-reacts with the impurity, covering the first semiconductor layer with a second layer including the impurity, and thereafter annealing to diffuse the impurity into the compound semiconductor.

2 Claims, 3 Drawing Sheets

IMPURITY DIFFUSION METHOD

FIELD OF THE INVENTION

The present invention relates to a dopant impurity diffusion method and, more particularly, to an improvement in a method of solid phase diffusion of zinc into a III-V group compound semiconductor.

BACKGROUND OF THE INVENTION

Dopant impurity diffusion is one of the techniques used for producing optical devices, such as photodiodes and semiconductor lasers. Vapor phase diffusion or solid phase diffusion are utilized for producing a p-type semiconductor region by diffusing zinc into InP series semiconductor materials.

The above-described vapor phase diffusion method includes selectively producing a diffusion-preventing film on a substrate, sealing the substrate with a dopant impurity diffusion source in a vacuum vessel, and diffusing by annealing, as shown in Japanese Published Patent Application 63-20878.

Solid phase diffusion includes producing a thin film of a dopant impurity or a compound including an impurity on a surface of a semiconductor by sputtering or electron beam deposition and diffusing the impurity from the film into the semiconductor, as shown in Japanese Published Patent Application 62-98721.

A method of solid phase diffusion of zinc into an InP substrate is described with reference to FIG. 2(a). A ZnO sputtered film 3 is produced as a diffusion source layer on a semi-insulating InP substrate 1 to a thickness of approximately 1,500 Angstroms. Thereafter, diffusion is carried out in a nitrogen ambient of approximately one atmosphere pressure at 550° C. for one hour. An $SiO_2$ film 4 is disposed on film 3 to prevent zinc from evaporating from the ZnO film 3 during annealing.

FIG. 2(b) shows a depth profile of carrier concentration when zinc is diffused into the InP substrate 1. This profile has approximately a $10^{18}$ cm$^{-3}$ charge carrier concentration at the surface. The charge carrier concentration decreases rapidly in the depth direction and, at a depth of approximately 8 microns from the surface, a diffusion front of constant concentration is reached. In addition, at the InP surface, after the diffusion, roughness is observed. Furthermore, when the diffusion temperature is raised and diffusion is carried out at 570° C., it is found that the charge carrier concentration is the same as that of the 550° C. and that the surface roughening is greater.

In the method of diffusing zinc into InP by the prior art solid phase diffusion technique, the carrier concentration is high only in the neighborhood of the surface and the concentration distribution becomes non-uniform and rapidly decreases in the depth direction. The surface is rough, resulting in quite a problem in device fabrication processes. Furthermore, even if the diffusion temperature is raised, the charge carrier concentration is not raised and it is difficult to obtain a charge carrier concentration above $10^{18}$ cm$^{-3}$.

SUMMARY OF THE INVENTION

The present invention is directed to solving the above-described problems and provides a dopant impurity diffusion method that eliminates surface roughness and that produces a diffusion depth profile in which the charge carrier concentration at the surface of the semiconductor material exceeds $10^{18}$ cm$^{-3}$, the carrier concentration distribution is uniform, and the diffusion front is steep inside the semiconductor material.

Other objects and advantages of the present invention will become apparent from the detailed description given hereinafter. It should be understood, however, that the detailed description and specific embodiments are given by way of illustration only, since various changes and modifications within the spirit and scope of the invention will become apparent to those skilled in the art from the detailed description.

In accordance with the present invention, a layer of a first semiconductor including no element that alloys with the constitutional elements of a compound semiconductor is produced on the surface of the compound semiconductor material, the first semiconductor layer is covered with a second layer including the impurity and, thereafter, annealing is carried out. The inventor found that when a ZnO film is directly produced as a diffusion source on the surface of InP, $Zn_3P_2$ is produced by alloying or a reaction between the phosphorus at the surface of InP and zinc during the diffusion. This alloy-reaction produces a roughness of the surface and obstructs diffusion of zinc into InP.

In accordance with the present invention, the dopant impurity concentration of a semiconductor layer in contact with a compound semiconductor material is lower, the alloying is greatly suppressed, and the roughness of the surface is eliminated. In addition, by suppression of the alloy reaction, the diffusion of the impurity into a semiconductor material is promoted, the carrier concentration at the surface of the semiconductor material is high and uniform, and a steep diffusion front inside the semiconductor material is obtained.

DETAILED DESCRIPTION OF THE PREFERRED EMBODIMENTS

Figure 1A:
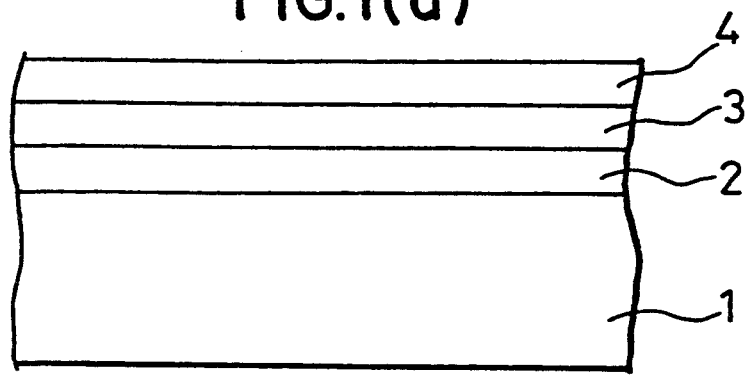
FIG. 1(a) is a diagram for explaining an impurity diffusion method according to an embodiment of the present invention and FIG. 1(b) is a graph showing a carrier concentration profile.
Figure 2A:
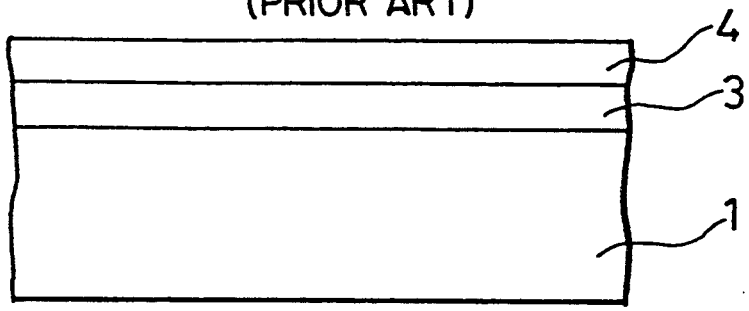
FIG. 2(a) is a diagram for explaining a prior art impurity diffusion method and FIG. 2(b) is a graph showing a carrier concentration profile.
Figure 2B:
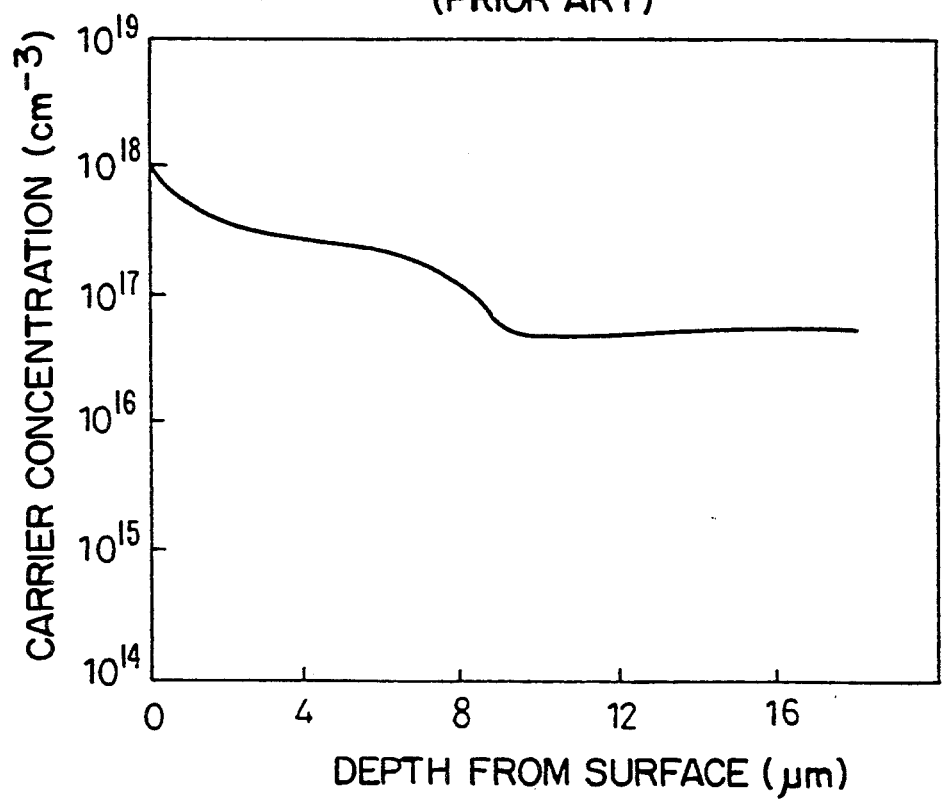

FIG. 1(a) shows a diagram explaining a dopant impurity diffusion method according to an embodiment of the present invention. In FIG. 1(a), the same reference numerals designate the same or corresponding elements as those shown in FIG. 2(a). Reference numeral 2 designates an InGaAs layer produced on a semi-insulating InP semiconductor substrate 1. On the InGaAs layer 2, the ZnO sputtered film 3 which is to become a dopant impurity diffusion source and the $SiO_2$ film 4 are successively produced.

The InGaAs layer 2 is produced on the semi-insulating InP substrate 1 by metal organic chemical vapor deposition or liquid phase epitaxy to a thickness of approximately 0.8 microns. Subsequently, a ZnO sputtered film 3 which is to be a diffusion source is produced on the InGaAs layer 2 to a thickness of approximately 1,500 Angstroms and the $SiO_2$ film 4 is grown thereon to a thickness of approximately 1,000 Angstroms.

Thereafter, diffusion is carried out at 600° C. in an $N_2$ ambient of one atmosphere pressure for one hour.

Figure 1B:
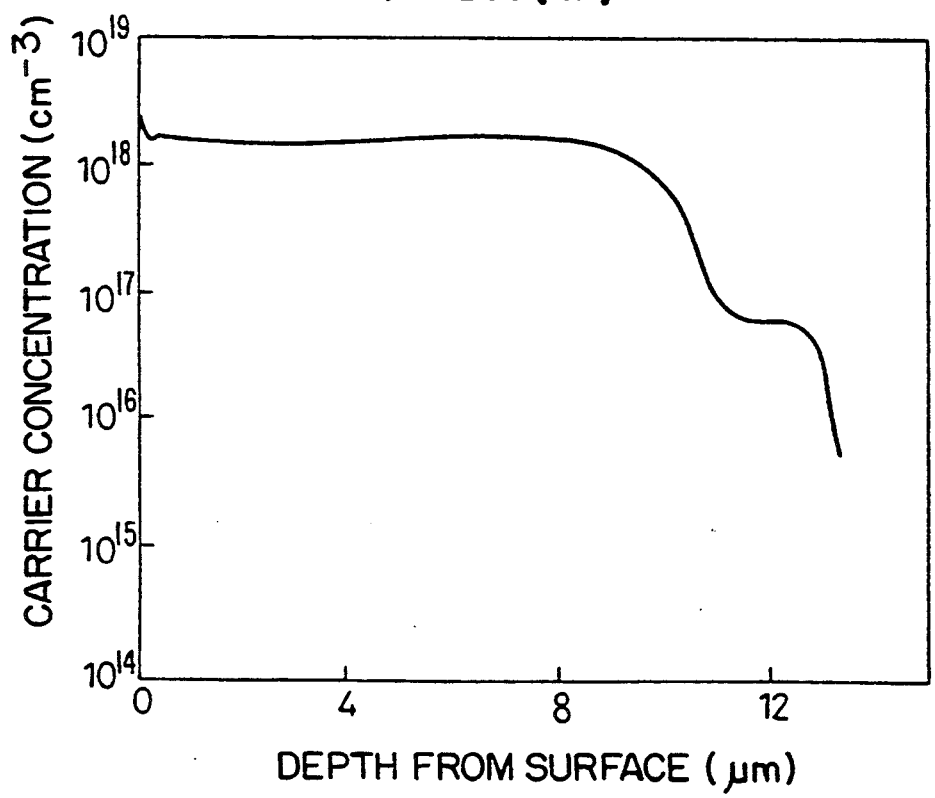

FIG. 1(b) shows a depth profile of the charge carrier concentration when zinc is diffused into the InP substrate 1 by the above-described solid phase diffusion method. The abscissa shows diffusion depth from the surface of the InP substrate and the ordinate shows carrier concentration.

The carrier concentration has a uniform distribution of approximately $2 \times 10^{18}$ cm$^{-3}$ to a depth of approximately 8 microns from the surface and, at a depth of approximately 10 microns, a steep diffusion front is seen. The steep diffusion front is advantageous in device fabrication. Furthermore, there is no roughness at the surface of the InP substrate 1 after the diffusion. This is because, by inserting InGaAs layer 2 between the InP substrate 1 and the sputtered film 3, the alloying of the constitutional element P of the substrate and the diffusing dopant impurity Zn is suppressed and zinc is easily diffused into InP.

Figure 3:
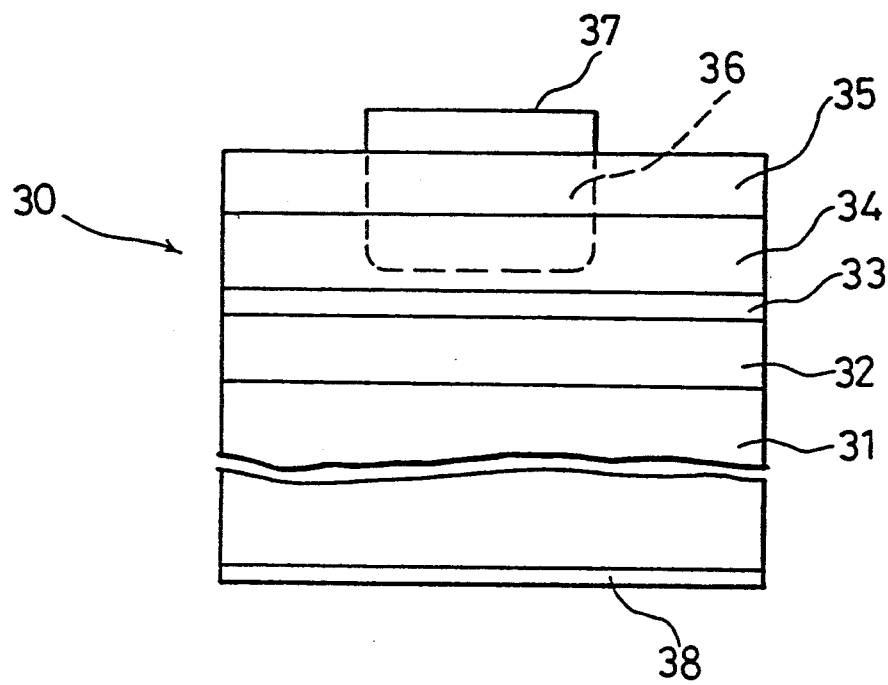
FIGS. 3 and 4 are cross-sectional views showing structures of a semiconductor laser and a photodiode produced utilizing the impurity diffusion method according to the present invention.

FIG. 3 shows a semiconductor laser produced by utilizing the above-described solid phase diffusion technique. In FIG. 3, reference numeral 30 designates a semiconductor laser. An n-type InP cladding layer 32, an InGaAsP active layer 33, and a p-type InP cladding layer 34 are successively produced on an InP substrate 31. In addition, an InGaAs layer 35, which does not include P which alloys with zinc, is produced on the InP cladding layer 34, and a diffusion region 36 is produced by diffusing zinc from a diffusion source layer (not shown) produced on the InGaAs layer 35. Reference numerals 37 and 38 designate a p side electrode and an n side electrode, respectively.

Since the dopant impurity concentration at the surface of the zinc-diffused layer is high and uniform, a good ohmic contact can be obtained between the p side electrode 37 and the InP cladding layer 34.

In the solid phase diffusion method of the above-described embodiment, a steep diffusion front is obtained and, therefore, when utilized for the production of a waveguide of a semiconductor laser, the waveguide effectively confines light.

Figure 4:
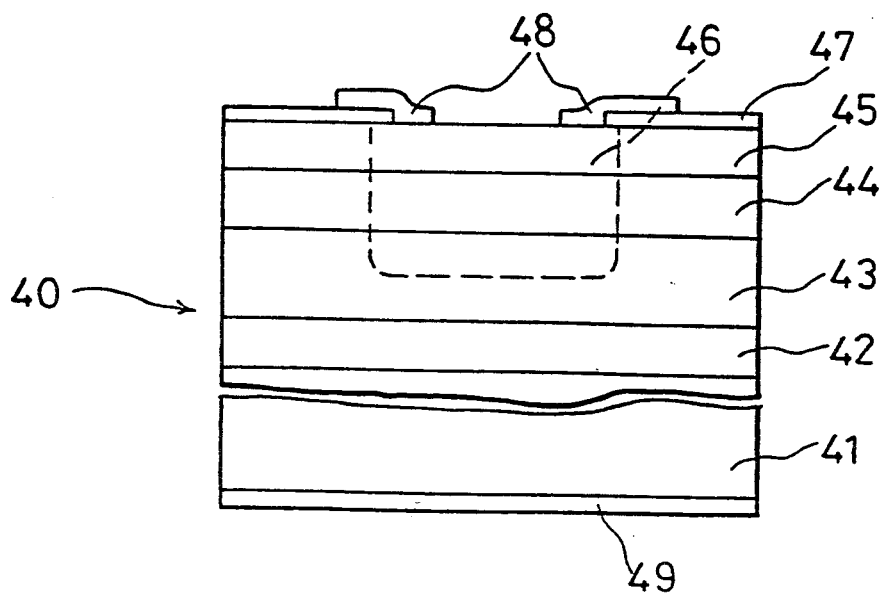

FIG. 4 shows a photodiode which is produced by utilizing the solid phase diffusion technique. Reference numeral 40 designates a photodiode. An n-type InP layer 42, an n-type InGaAs layer 43, and an n-type InP layer 44 are produced on the InP substrate 41. An InGaAs layer 45, which does not include P which alloys with zinc, is produced on the InP layer 44, and a diffusion region 46 is produced by diffusion of zinc from a diffusion source layer (not shown) produced on the InGaAs layer 45. Reference numeral 47 designates an insulating film and reference numerals 48 and 49 designate electrodes.

Because the impurity concentration is high and uniform, a good ohmic electrode can be easily produced and, because the diffusion front is steep, the position of the pn junction can be accurately controlled.

In this embodiment, the surface of the InP layer including phosphorus as a constitutional element is covered by an InGaAs layer which does not include phosphorus as a constitutional element, a dopant impurity diffusion source ZnO layer including zinc is produced on the InGaAs layer, and zinc is diffused into the InP layer by thermal annealing. Therefore, the dopant impurity concentration of the semiconductor layer in contact with an InP layer is lower, the alloy reaction is largely suppressed, and the roughness of the surface is eliminated. Furthermore, by suppression of the alloy reaction, the diffusion of zinc into the InP layer is promoted, the carrier concentration at the InP surface is increased and made uniform, and a steep diffusion front inside an InP layer is obtained.

In the illustrated embodiment, diffusion of a dopant impurity into InP is described, but the method can be applied to ternary and quaternary compound semiconductors including P, such as InGaP and InGaAsP. In summary, the layer inserted between the diffusion source layer and the InP layer may not include phosphorus which alloys with zinc. The thickness of the layer is not limited.

In addition, the semiconductor layer into which zinc is diffused is not limited to a semiconductor layer including phosphorus as a constitutional element, and, for example, a compound semiconductor layer including aluminum as a constitutional element, such as AlInGaAs, can be used. In this case, because aluminum and zinc or oxygen react with each other, the surface of the compound semiconductor layer is covered by a semiconductor layer which does not include aluminum as a constitutional element, such as an InGaAs layer, and, thereafter, annealing is carried out to diffuse the dopant impurity. Thereby, the above-described reaction can be suppressed and the same effects as the above-described embodiment can be obtained.

As is evident from the foregoing description, according to the present invention, while diffusing a dopant impurity into a compound semiconductor material, a first semiconductor layer which does not include an element that alloys with the impurity is produced on a surface of a compound semiconductor material, the first semiconductor layer is covered by a second layer including the impurity, and, thereafter, annealing is carried out whereby surface roughness after the diffusion is eliminated, a charge carrier concentration of about $10^{18}$ cm$^{-3}$ is obtained, and a steep diffusion front is obtained in the diffusion profile, thereby enabling application of the methods to devices, such as semiconductor lasers and photodiodes.

What is claimed is:

1. A method of diffusing zinc into a compound semiconductor substrate comprising:
    depositing a layer of InGaAs on an AlInGaAs substrate;
    depositing a layer of ZnO on the layer of InGaAs as a source of zinc; and
    raising the temperature of the compound semiconductor substrate and the InGaAs and ZnO layers to diffuse zinc from the ZnO layer through the InGaAs layer into the compound semiconductor substrate.

2. The method of claim 1 including depositing an SiO$_2$ layer on the ZnO layer before raising the temperature of the substrate and the InGaAs and ZnO layers.

* * * * *